United States Patent [19]

Leger

[11] 4,327,835
[45] May 4, 1982

[54] UNIVERSAL SNAP-IN CARD GUIDE FOR PRINTED CIRCUIT CARD ENCLOSURES

[75] Inventor: Laurie J. Leger, Bradford, Mass.

[73] Assignee: Honeywell Information Systems Inc., Waltham, Mass.

[21] Appl. No.: 110,880

[22] Filed: Jan. 10, 1980

[51] Int. Cl.³ .................. A47G 19/08; B42F 17/16; H02B 1/02

[52] U.S. Cl. ................................ 211/41; 211/46; 361/399; 361/415

[58] Field of Search ............. 211/41, 46; 361/399, 361/415; 248/DIG. 3; 312/332, 349

[56] References Cited

U.S. PATENT DOCUMENTS

| | | | |
|---|---|---|---|
| 3,664,510 | 5/1972 | Kerschbaum | 211/41 |
| 3,696,936 | 10/1972 | Straccia | 361/415 |
| 3,723,823 | 3/1973 | Lit | 211/41 |
| 3,775,643 | 11/1973 | Schachnow | 361/399 |
| 3,878,438 | 4/1975 | Weisman | 361/415 |
| 3,899,721 | 8/1975 | Borchard | 361/415 |
| 4,019,099 | 4/1977 | Calabro | 211/41 |

Primary Examiner—Reinaldo P. Machado
Attorney, Agent, or Firm—William A. Linnell; Nicholas Prasinos

[57] ABSTRACT

A printed circuit card enclosure is disclosed having end plates and shelf members which are secured together to form the enclosure. The shelf members are provided with holes for receiving flexible snap-in card guides which are used to retain and support printed cards within the enclosure. The shelf members and card guides are further designed such that in a card enclosure designed to retain multi-levels of printed circuit cards, a single shelf member may be shared between two adjacent levels of printed circuit cards and the card guides installed within a single set of holes with the upper card guide being used to retain the lower edges of printed circuit cards in the upper level and the lower card guides being used to retain the upper edges of printed circuit cards in the adjacent lower level.

25 Claims, 7 Drawing Figures

FIG. 7

UNIVERSAL SNAP-IN CARD GUIDE FOR PRINTED CIRCUIT CARD ENCLOSURES

BACKGROUND OF THE INVENTION

This invention relates to field of modular electronic assemblies and, more particularly, to enclosures or racks for mechanically and electronically coupling a plurality of printed circuits (p.c.) cards or boards so as to constitute an electronic circuit and to the card guide for aligning and retaining the p.c. boards within such enclosures.

With the advent of printed circuits, many attempts have been made to design enclosures or racks for holding a series of removable, plug-in type p.c. boards. However, many prior enclosure designs have resulted in either substantial initial costs in tooling up to produce the card enclosure or in substantial recurring cost in the manufacturing of the card enclosure components and assembly of the enclosure components into a finished enclosure. Also, many prior enclosure designs do not easily accommodate printed circuit boards of varying sizes or allow for the space between printed circuit boards to be easily varied. One such present enclosure system requires that a plastic card guide with multiple channels, one for each printed circuit board to be retained by the guide, be molded as a unit with the length of the card channel being approximately the length of the printed circuit card and the spacing between card channels being equal to the desired distance between the printed circuit cards within the enclosure. The system has a high initial cost to develop the mold for the card guide and requires a new mold to be designed if the intercard spacing is to be changed or if the length of the p.c. cards is changed. Further, this system may require that multiple card guides be designed and molded if the card guide is not symmetrical such that it can be used for both the top and the bottom guide within the enclosure system.

Another printed circuit card enclosure system of the type described in U.S. Pat. No. 3,696,936 to W. J. Straccia et al, issued Oct. 10, 1972, may be used. In this system, end plates suport metal shelf members which are provided with holes and slots for receiving flexible snap-in card guides which accommodate the printed circuit cards. This system requires a slot and a circular hole to be punched for each flexible card guide used within the enclosure. This system offers more flexibility with respect to the distance between printed circuit cards by allowing the punching of the holes and slots which receive the snap-in card guides to be varied according to the intercard spacing needs as dictated by height of components on the p.c. cards and by electronic cooling requirements. While this manufacturing process produces a card enclosure having the requisite reliability and satisfying all electrical requirements, the manufacturing costs in small production runs are relatively high because of the fact that two different perforations requiring a tool change must be made in the metal shelf to accommodate each snap-in card guide, one perforation being that of a circular hole and the second perforation being that of a slot. Further, this system requires two metal shelf members per level of printed circuit cards used within an enclosure and does not allow for a single shelf member to be shared between adjacent upper and lower levels of printed circuit cards which are arranged in a back-to-back manner.

The instant invention is directed to achieving an improved printed circuit card enclosure system which will satisfy all mechanical and electrical requirements of the application and which will result in a substantial reduction in manufacturing cost. In addition to meeting the mechanical requirements of rigidity and resistance to vibrational stress, the instant invention meets the need of a low-cost printed circuit card enclosure which can be economically manufactured on an assembly line basis or in small production runs.

It is accordingly an object of the present invention to provide a printed circuit card enclosure system having a low initial tooling cost and a low individual unit for assembly-manufacturing cost. The further object is to provide a printed circuit card enclosure system which can be easily modified to accommodate varying size printed circuit cards, varying spacings between printed circuit cards and varying numbers of printed circuit cards within the enclosure.

SUMMARY OF THE INVENTION

In accordance with the principles of the instant invention, a printed circuit card enclosure system is manufactured by perforating a metal shelf member to receive a plurality of flexible snap-in printed circuit card guides. A metal shelf member is perforated such that two rectangular openings are provided in the metal shelf member to receive the snap-in clip and aligning peg on each end of the snap-in card guide. The snap-in card guide is molded in such a manner that across the length of the flexible guide is a U-shaped channel to receive one edge of the printed circuit card. Each end of the card guide has a rectangular aligning peg and a flexible L-shaped clip protruding from the bottom of the card guide. When snapped in place within the rectangular holes in the shelf member, the L-shaped clips protrude through the shelf member such that the horizontal member or ear of the L-shaped clips can hook the opposite side of the shelf member and retain the card guide in place. The rectangular aligning pegs also protrude into the rectangular holes to align the card guide and restrain any sideway or lateral motions of the card guide and provide for the precisional alignment of the card guide with its corresponding electrical connector into which the printed circuit card plugs in order to make electrical contact. By further providing that the L-shaped clips and rectangular aligning pegs are molded in an asymmetrical manner with respect to the axis of the printed circuit card guide, it is possible to place the card guides back-to-back on one shelf member is such a manner that multiple levels of printed circuit cards many be accommodated within an enclosure by using a single shelf member between each two adjacent levels of printed circuit cards within the enclosure. The printed circuit card guide is further designed such that it may be inserted and removed manually without the use of special tools. Further, a series of insertions and removals does not substantially affect the aligning nor retaining power of the card guide.

This invention is pointed out with particularity in the appended claims. An understanding of the above and further objects and advantages of this invention may be obtained by referring to the following description taken in conjunction with the drawings.

BRIEF DESCRIPTION OF THE DRAWINGS

The manner in which the apparatus of the present invention is constructed and its mode of operation can best be understood in light of the following detailed description together with the accompanying drawings in which like reference numerals identify like elements in the several figures and in which.

DETAILED DESCRIPTION OF THE PREFERRED EMBODIMENT

Figure 1:
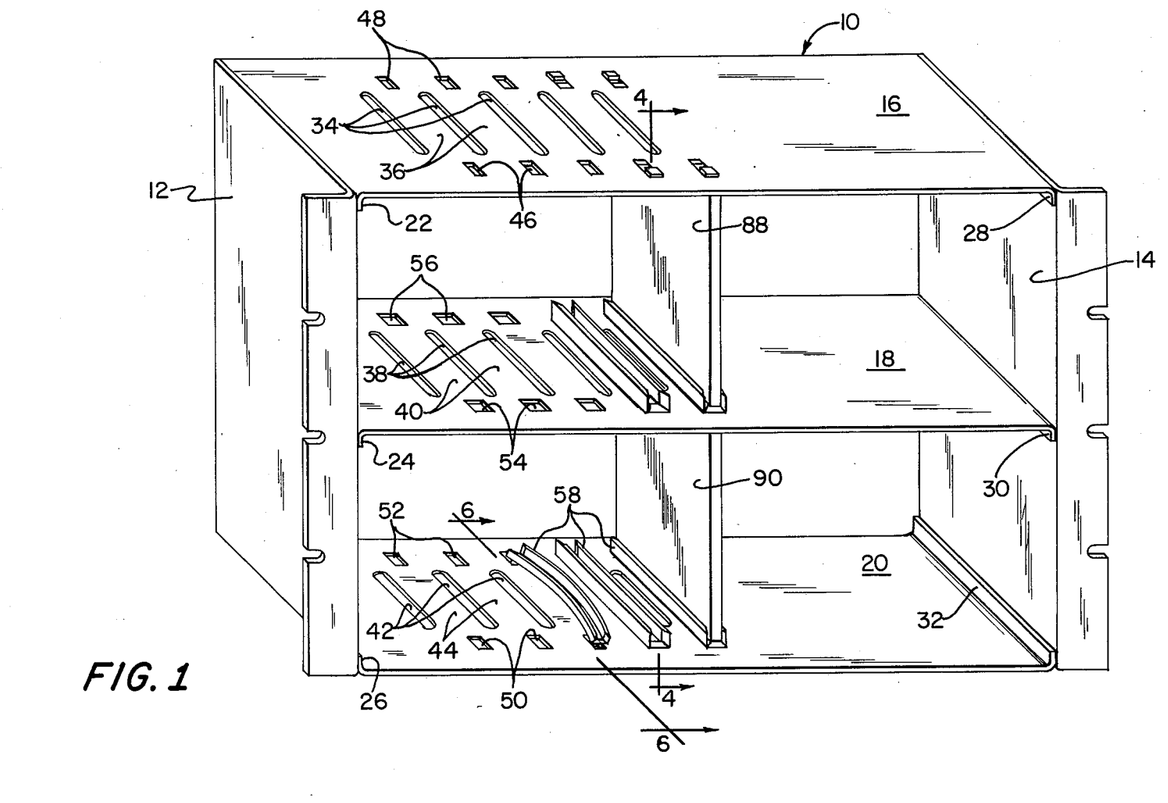
FIG. 1 is a perspective view of multi-level p.c. card enclosure for retaining p.c. cards in parallel vertical planes showing two p.c. cards in two pairs of card guides.

Referring to FIG. 1, the card enclosure or rack 10 comprises a pair of vertical end plates, 12 and 14, which support the horizontally extending, vertically spaced, upper, middle and lower support members or shelves 16, 18 and 20. Shelf members 16, 18, and 20 include left flanges 22, 24 and 26, and right flanges 28, 30 and 32, which are integral with the shelf members, and which are bent downwardly or upwardly at right angles so as to extend in the left and right vertical plains. These left and right flanges on shelf members 16, 18 and 20 are used to secure the shelf members to end plates 12 and 14 by spot-welding, screws, bolts or other fastening methods.

In addition to the flanges illustrated in FIG. 1, other flanges, not shown in FIG. 1, may be provided on the rear edges of end plates 12 and 14 or shelf members 16, 18 and 20 for the purpose of securing vertically aligned electrical connectors to the back of the card enclosure. Such female electrical connectors, which are not shown in FIG. 1, are aligned in the rear vertical plain to receive the rear edge of the printer circuit cards when placed in the card enclosure 10. The card rack thus far described is for illustrative purposes; the exact detail and methods by which the horizontal shelf members 16, 18 and 20 are supported and secured are important only to the extent that the shelf members must be supported by structure which will maintain the vertical spacing between the upper, middle and lower shelf members 16, 18 and 20 and also maintain their alignment with respect to each other.

As shown in FIG. 1, upper shelf member 16 is further provided with a series of elongated slots or vents 34 which are interspaced by relatively narrow solid portions 36. Middle and lower shelf members 18 and 20 are similarly provided with vertically aligned slots 38 and 42 and vertically aligned solid portions 40 and 44 respectively. Vents 34, 38 and 42 are optionally provided within the shelf member if vertical air circulation is required for the cooling of the electronic components on the printed circuit cards. Along the front and rear portions of upper shelf member 16 are provided a series of small apertures in the form of rectangular holes 46 and 48, respectively, each of which is positioned such that one edge of the rectangular hole is centered between a pair of vents 34. Holes 36 are in front to back alignment with holes 48 in upper shelf member 16. Similarly, along the front and rear portion of lower shelf member 20, a series of small apertures in the form of rectangular holes 50 and 52, respectively, each of which is positioned with one edge of the hole centered between a pair of vents 42. Holes 50 are in front to back alignment with holes 52 in lower shelf member 20. For illustrative purposes, holes 46 and 48 in shelf member 16 are shown to the right of the center line between vent 34, and holes 50 and 52 in lower shelf member 20 are shown to the left of the center line between vents 42. As seen hereinafter, holes 46 and 48 could equally have been to the left of the center line and holes 50 and 52 to the right of the center line, or they could all have been aligned on the same side of the center line.

Figure 2:
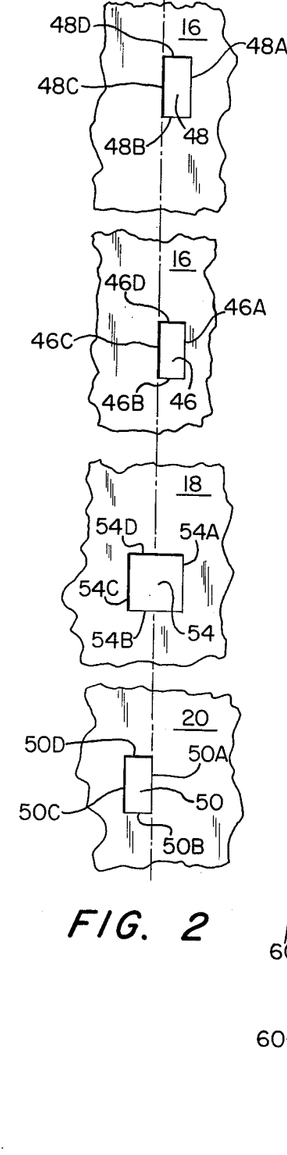
FIG. 2 is an enlarged top plan fragmentary view of two portions of the upper shelf member, a portion of the middle shelf member, and a portion of the lower shelf with the middle shelf member extended forward of the upper shelf member and the lower shelf member extended forward of the middle shelf member.

Along the front and rear portions of middle member 18 there are provided a series of small apertures in the form of rectangular holes 54 and 56, respectively, each of which is centered between a pair of vents 38. Holes 54 are in front to back alignment with holes 56 in middle shelf member 18 and are twice the width of holes 46, 48, 50 and 52. The left to right alignment of holes 46, 48, 50, 52, 54 and 56 is more clearly shown in FIG. 2, which illustrates portions of upper shelf member 16 containing one of the holes 46 and one of the holes 48, middle shelf member 18 containing one of the holes 54 and lower shelf member 20 containing one of the holes 50. The center line in FIG. 2 represents the center between optional vents 34 in upper shelf member 16, optional vents 38 in middle shelf member 18 and optional vents 42 in lower shelf member 20. When shelf members 16, 18 and 20 are properly positioned within a card enclosure the front and rear edges of a hole 46 is in vertical alignment with the front and rear edges of one of the holes 54 and one of the holes 50. Similarly, the front and rear edges of one of the holes 48 is in vertical alignment with one of the holes 56 and one of the holes 52. When a card guide is snapped into position on the lower surface of upper shelf member 16, the center of the card guide will be in vertical alignment with the center line shown in FIG. 2. Similarly, when a card guide is snapped in place on the upper surface of lower shelf member 20 the center line of the card guide will be in vertical alignment with the center line shown in FIG. 2. When a pair of card guides is snapped into place on middle shelf member 18, with one card guide being on the upper surface and the other card guide being on the lower surface, the center lines of both the upper and lower card guides will be in vertical alignment with the center line shown in FIG. 2. With the center line of opposing card guides 58 aligned vertically, each pair of card guides will retain a printed circuit board in a vertical plane as illustrated in FIG. 1 for printed circuit boards 88 and 90.

Figure 3A:
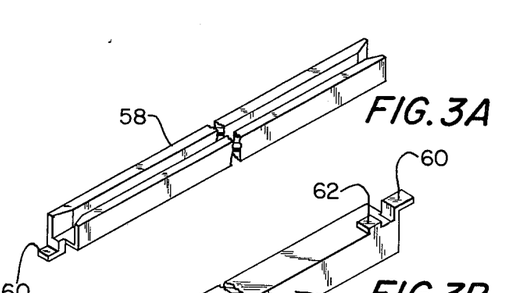
FIG. 3A and FIG. 3B are perspective top view and bottom view, respectively, of one of the card guides.
Figure 3B:
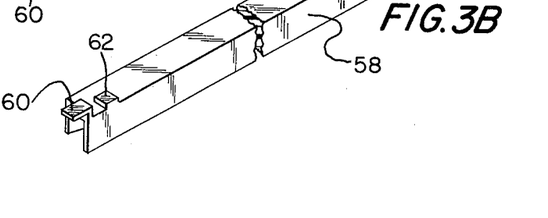
Figure 3C:
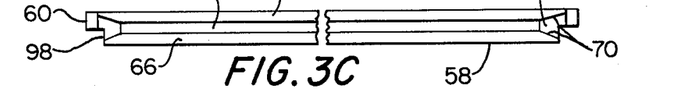
FIG. 3C, FIG. 3D, FIG. 3E and FIG. 3F are top plan view, side elevation view, bottom plan view and end elevation view, respectively, of one of the card guides.
Figure 3D:
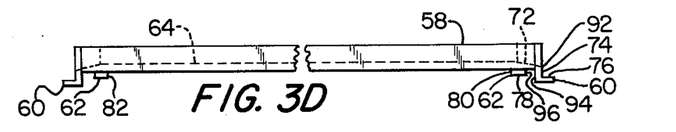
Figure 3E:
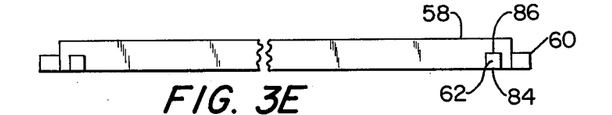
Figure 3F:
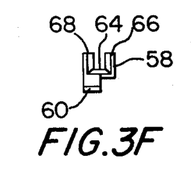
Figure 4:
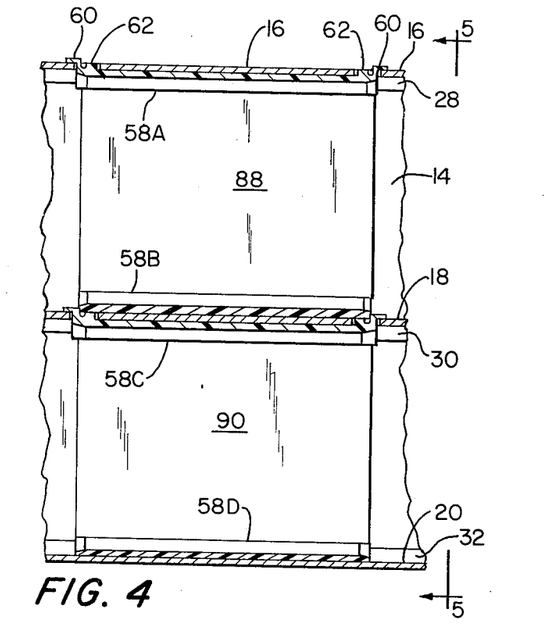
FIG. 4 is a cross-sectional view taken along the vertical plane through the center of the card guides and indicated by view line 4—4 in FIG. 1 and FIG. 5.
Figure 5:
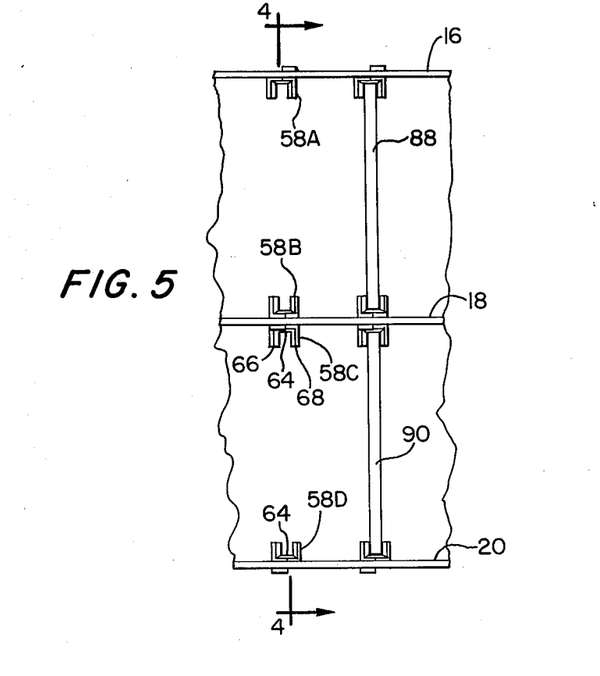
FIG. 5 is a front elevation view taken along the plane indicated by view line 5—5 of FIG. 4 showing a fragmentary portion of the front of the upper, middle and bottom shelf members with 8 card guides and two printed circuit boards in place.

As most clearly shown in FIGS. 1, 4 and 5, the card enclosure is adapted to receive four series of molded guides 58, all of which are identical and one of which is shown in greater detail in FIGS. 3A through 3F. As shown in FIG. 5, one series of card guides 58 is positioned on the lower surface of upper shelf member 16, a second series of card guides is positioned on the upper surface of the middle shelf member 18, a third series of card guides is positioned on the lower surface of shelf member 18 and the fourth series of card guides is positioned on the upper surface of lower shelf member 20. The guides 58 is composed of a resilient deformable material and are preferably composed of an easily molded plastic material. In the preferred embodiment, the Merlon polycarbonate plastic manufactured by Mobay Chemical Corporation has been found to work satisfactorily.

FIGS. 3A and 3B are respectively top and bottom perspective views of a card guide 58 and illustrate the snap retaining clips 60 and aligning pegs 62 found on each end of the card guide 58. Each of the guides 58 includes a base 64 and a pair of upstanding sides 66 and 68, which form a U-shaped cross section as shown in FIG. 3F. This U-shaped channel is adapted to slidably receive the printed circuit boards. The ends of sides 66 and 68 are bevelled at 70 while the ends of base portions 64 are bevelled to form ramps 72 as shown in FIG. 3C and FIG. 3D, respectively. Three card guides 58 are shown in FIG. 1 on the lower shelf member 20 with the leftmost guide shown in a bowed position as it is being inserted. This bowed card guide is shown most clearly in FIG. 6 as discussed hereinafter.

As shown most clearly in FIG. 3D, each of the guides is molded with a pair of integral L-shaped snap clips 60 and aligning pads 62, which are shaped so as to snap into aligned holes 46 and 48, aligned holes 54 and 56, or aligned holes 50 and 52 in the shelf members. The length of clip riser 74 of L-shaped snap clip 60 is such that the snap clip 60 can project through the thickness of a metal shaft member such that clip ear 76 will engage the opposite side of the shelf member and retain the guide 58. Further, the depth of aligning pegs 62 is such that it is slightly less than the thickness of the shelf member such that the bottom surface 78 of aligning pegs 62 will not project through the shelf member when the guide is snapped in place. In the preferred embodiment which uses shelf member of 16 gauge cold rolled steel (0.060 inch thickness), the length of the risen chip is 0.065 inches and the depth of the aligning pegs 62 is 0.055 inches. That is, snap clip 60 and aligning pegs 62 are shaped and sized so as to snap into holes 46, 48, 50, 52, 54 and 56 and thereby readily secure the ends of the guides 58A to upper shelf member 16, as viewed in the top portion of FIGS. 4 and 5. L-shaped snap clip 60 and aligning pegs 62 are also shaped and sized so that two guides, 58B and 58C, may be snapped into holes 54 and 56 in a back-to-back manner as shown in the middle portion of FIGS. 4 and 5 whereby one guide 58B is on the upper surface of shelf member 18 and the other guide 58C is on the lower surface of shelf member 18. The bottom portion of FIG. 4 does not show the aligning pegs 62 and snap clips 60 of card guide 58D or their corresponding aligning holes in lower shelf member 20 because they are in the portion of the cross-section which has been removed. Similarly, the aligning pegs 62 and snap clips 60 of card guide 58B are in that portion of the cross-section removed and not shown in FIG. 4.

In both single-sided and back-to-back applications, aligning pegs 62 of card guides 58 serve to properly align the card guides within the card enclosure and to prevent the axial motion of the card guide (i.e., the left and right motion of the card guide 58A with respect to their shelf member 16 in FIG. 4) and the lateral motion of the card guide (i.e., the left and right motion of the card guides with respect to the shelf member 18 as shown in FIG. 5). Similarly, in both single-sided and back-to-back applications, L-shaped snap clips 60 are used to retain the card guides 58 within the rectangular holes of the shelf member.

As shown most clearly in FIG. 3D, vertical surface 80 of right aligning peg 62 is used to prevent a leftward axial movement of the card guide with respect to the shelf member. Similarly, vertical surface 82 of left aligning peg 62 is used to prevent the rightward axial movement of the card guide with respect to the shelf member. Referring now to FIG. 3E, it can be seen that vertical surfaces 84 and 86 of aligning pegs 62 prevent the lateral motion of the card guide 58 with respect to the shelf member by being in close proximity to the edges of the rectangular holes in the shelf member. That is, surface 84 prevents the downward (in FIG. 3E) and surface 86 prevents the upward (in FIG. 3E) motion of the card guide with respect to the shelf member. In back-to-back applications in which one card guide is mounted on one side of a single shelf member and a second card guide is mounted on the opposing side of the same shelf member, surface 84 of the first card guide prevents lateral motion in one direction and surface 84 of the opposing card guide prevents lateral motion in the opposite direction. Surface 86 of one card guide being in contact with surface 86 of the opposing card guide prevents lateral motion of the one card guide with respect to the other card guide and the shelf member in back-to-back applications in which rectangular aligning holes of double width are used. This can be appreciated by referring to FIG. 5 in which, although not shown, it can be appreciated that surface 84 of the aligning pegs of guide 58B prevents the leftward lateral motion of guides 58B and 58C and surface 84 of the aligning pegs 62 of guide 58C prevents the rightward motion of guides 58C and 58B. It further can be appreciated that surfaces 86 of aligning pegs of guide 58B are in contact with surfaces 86 of the aligning pegs of guide 58C such that guide 58B cannot move laterally to the right with respect to guide 58C and guide 58C cannot move laterally to the left with respect to guide 58B.

Turning to FIG. 3E, it can be appreciated that the width of the rectangular aligning holes in singlesided applications must be approximately equal to the distance between surface 84 and surface 86 of aligning pegs 62. It can be further appreciated that surface 86 of aligning pegs 62 must be approximately on the center line of guides 58. In the preferred embodiment for card guides used to retain printed circuit cards of 0.080 inch nominal thickness, the distance between surface 84 and surface 86 of aligning pegs 62 is .123 inches with a tolerance of minus 0.005 inches. Referring now to FIG. 2, in the preferred embodiment, the distance between edge 48A and edge 48C of rectangular aligning holes 48, between edge 46A and edge 46C of rectangular aligning holes 46 and edges 50A and 50C of rectangular aligning holes 50 is 0.125 inches plus 0.005 inches or minus 0.000 inches. Correspondingly, in the preferred embodiment, the distance between edge 54A and 54C of rectangular aligning holes 54 is 0.250 inches plus 0.005 inches or minus 0.000 inches.

Referring now to the right end of the card guide in FIG. 3D, it can be seen that the length of the rectangular aligning holes in the shelf member must be sufficient to accommodate both the aligning pegs 62 and the snap clips 60. In fact, the length of the rectangular aligning holes in the shelf member is greater than the distance between vertical surface 80 of aligning peg 62 and the right-most surface of riser 74 of snap clip 60. The length of the aligning holes must also be less than the distance between vertical surface 80 of aligning peg 62 and the right-most tip of ear 76 of snap clip 60. In the preferred embodiment, the distance between surface 80 of aligning peg 62 and the right-most edge of riser 74 of snap clip 60 is 0.210 inches and the length of the ear 76 which extends past the right-most edge of riser 74 is 0.080 inches. This results in the distance between surface 80 and the tip of snap clip 60 being 0.290 inches. In the preferred embodiment, the length of rectangular aligning hole (i.e., the distance between edge 48D and edge 48B of holes 48, between edge 46D and 46B of holes 46, between edge 54D and edge 54B of holes 54 and between edge 50D and 50B of holes 50 in FIG. 2) is 0.250 inches which results in the outer 0.040 inches (right-most end in FIG. 3D) of ear 76 of snap clip 60 being in contact with the upper or the lower surface of the shelf member and thereby retaining the card guides 58 in the shelf member.

Again, referring to FIG. 3D, it should be noted that the thickness of riser 74 of snap clips 60 is less than the thickness (left-to-right dimension) of aligning pegs 62. In the preferred embodiment, the thickness of aligning pegs 62 is 0.100 inches and the thickness of riser 74 of snap clips 60 is 0.030 inches. As seen hereinbefore, the aligning pegs 62 must take the shearing action of the lateral and axial motion of the card guide with respect to shelf member. The riser 74 of snap clips 60 must be sufficiently thin such that snap clips 60 remain flexible, and can be rotated toward aligning pegs 62 so that they may be inserted within the rectangular holes of the shelf members. Further, when installed in a shelf member, the right-most surface (in FIG. 3D), of riser 74 of right snap clips 60 is not in contact with the edge of the rectangular aligning holes within the shelf member such that riser 74 need not be sized to withstand the shearing force which would otherwise be applied to it if it was in contact with the edge of the rectangular aligning hole and a force to the right in FIG. 3D was applied to the card guide 58. As can be appreciated in FIG. 3D, if surfaces 80 and 82 of aligning pegs 62 are to prevent the axial movement of the card guide with respect to the shelf member, then the distance between edge 46D of hole 46 and edge 48B of hole 48 of FIG. 2 must be approximately equal to the distance between surface 80 and surface 82 of aligning pegs 62. In the preferred embodiment, in which the card guide is approximately 5.2 inches in length, not counting the length of the snap clip ears 76, the distance between surface 80 and surface 82 is 4.782 inches plus or minus 0.005 inches. The corresponding distance between edges 46D and 48B of holes 46 and holes 48 in shelf member 16, between edges 54D and 56B (not shown) of holes 54 and holes 56 in shelf member 18 and between edges 50D and 52B (not shown) of holes 50 and 52 in shelf member 20 is 4.785 inches plus 0.005 inches or minus 0.000 inches.

Before leaving FIG. 3D, it should be noted that the space between the snap clips 60 and aligning pegs 62 at the ends as card guides 58 is provided such that snap clip 60 can be flexed backwards into the space when the card guide is being inserted into a hole in a shelf member. This flexing of snap clips 60 during the insertion process can be more clearly seen in FIG. 6 which shows a bowed card guide 58 as it is being inserted into shelf number 20. Referring to FIG. 3D, the space between vertical surface 94 of snap clip 60 and vertical surface 96 of aligning peg 62 must be sufficient to allow snap clip 62 to flex to the left as it is inserted into an aligning hole in a shelf member.

Figure 6:
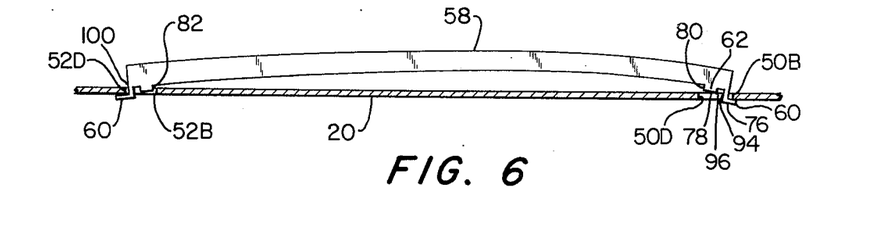
FIG. 6 is a cross-sectional view taken along the vertical plane through the outer edge of a card guide being installed on the bottom shelf of the card enclosure and indicated by view line 6—6 in FIG. 1.

Referring now to FIG. 3C, it can be seen that each end of the card guide 58 is provided with a notch 98 in the base to accommodate the snap clip 60 of the opposing card when the card guides are used in a back-to-back manner. The end of each card guide must be notched back such that notch 98 is sufficient to accommodate the snap clip of the opposing card guide in back-to-back applications so that the second card guide may be inserted in the aligning holes of a shelf member without the base of the first card guide interfering with the insertion of the snap clip 60 of the second card guide. This is shown most clearly in FIG. 6, which illustrates a card guide 58 being inserted into lower shelf member 20. In FIG. 6, the left end of card guide 58 was inserted first into hole 52 as defined by edges 52B and 52D in FIG. 6. In FIG. 6, vertical surface 82 of left aligning peg 62 is in contact with edge 52B of hole 52 and vertical surface 100 of the left snap clip 60 is not in contact with edge 52D of hole 52.

Once the left end of card guide 58 is engaged in hole 52, as shown in FIG. 6, the right end of card guide 58 is engaged by bowing the card guide in the middle by applying an upper force to the middle of the card guide and a downward force to the right end of the card guide 58. It should be noted that the clip ear on the left snap clip 60 retains the left end of card guide 58 in hole 52. As the card guide 58 is bowed, the distance between surface 82 and the tip of the clip ear on the right end of snap clip 60 on the right end of card guide 58 is shortened sufficiently such that the tip of the snap clip 60 will clear edge 50B of hole 50 and permit the right snap clip 60 to enter aligning hole 50. As the right end of card guide 58 is continued to be pressed downward into hole 50, the right snap clip 60 is flexed to the left as the ear of the clip touches edge 50B of hole 50. As illustrated in FIG. 6, the downward force on the right end of card guide 58 continues, snap clip 60 is flexed to the left and the corner of right aligning peg 62, as defined by the intersection of bottom surface 78 and vertical surface 80 comes in contact with the corner of shelf member 20 as defined by intersection of the top surface of shelf member 20 and edge 50D of hole 50. Continued pressure on the right end of the card guide 58 results in the snapping-in of right aligning peg 62 and the snapping-out of right snap clip 60 such that the ear of right snap clip 60 engages the lower surface of shelf member 20.

The bottom surface of the tip of the clip ears 76 of snap clips 60 may be bevelled to help flex the snap clips backwards when the free (second) end of the card guide is inserted into its aligning hole. Further, the heels of the aligning pegs 62 formed by the intersection of surface bottom 78 and vertical surface 80, may be radiused to aid in the snapping-in of the aligning peg on the free end of the card guide. When the free end of the card guide is snapped into position in the second aligning hole, the flexible snap clip 60 returns to its original position due to the resiliency of the snap clips 60 and the card guide 58 is held firmly in place and is retained from falling or vibrating out of position within the card enclosure. Thus, the card guides are easily manually inserted into the aligning holes on the shelf member with access only being required on the side of the shelf member to which the card guide, and ultimately the printed circuit board, will be placed. The removal of the card guide is similar to the insertion process only in reverse. Thus, to remove a card guide from a shelf member, upper pressure is exerted which results in the snapping-out of the aligning peg 62 and snap clip 60 at one end of the card guide from aligning hole. Further rotation of the card guide results in the second end of the card guide snapping-out of its aligning hole in the shelf member.

As shown most clearly in FIG. 5 and from the foregoing structural description, it will be apparent that the initial insertion of the printed circuit board 88 and 90 is facilitated and guided by the bevelled edges 70 and ramps 72 as shown in FIGS. 3C and 3D. As a card is further pushed into the upper and lower card guides 58, the rear edge of the printer circuit card will be guided into its mating electrical connector. As is apparent in FIG. 5, by examining card guide 58C the U-shaped channel, formed by base 64 and upstanding sides 66 and 68, must be of sufficient depth so that the narrowest printer circuit card will not fall out of the top card guide 58C when taking into account the tolerance in width allowed in the printer circuit cards. That is, the vertical distance between the base 64 of card guide 58D and the bottom edge of sides 68 and 66 of card guide 58C must be less than the width of the narrowest printer circuit card so that it will be retained between middle shelf member 18 and lower shelf member 20.

The foregoing description has been in terms of horizontal shelf members containing rectangular aligning holes into which are snapped card guides which are used to retain printer circuit cards in vertical planes as illustrated in FIGS. 1, 4 and 5. Other features in the present invention are most clearly shown in FIG. 7 which shows card enclosure 110, which consists of vertical end plates 112 and 114, center support 120 and horizontal shelf members 116 and 118. As illustrated, card enclosure 110 is designed to house a maximum complement of two full-size printed circuit board and six half-size printed circuit boards in five parallel horizontal planes. Each printed circuit board, whether full-size or half-size, is to be retained in the horizontal plane by the use of four card guides 58 (not shown in FIG. 7). That is, the left side of each printed circuit board is to be supported by the use of two card guides 58 aligned in an end-to-end manner and supported by end plate 114 or center support 120 and the right edge of each printed circuit board is to be retained by another two card guides 58 aligned end-to-end and supported by end plate 112 or center support 120.

End plate 114 is provided with four columns, 112, 124, 126 and 128 of rectangular aligning holes, with five holes in each column. End plate 112 is similarly provided with four columns of rectangular aligning holes with five holes in each column (only column 132 is fully visible in FIG. 7). Center support 120 is attached to and supported by lower shelf member 118 and does not proceed up to or attach to upper shelf member 116. Center support 120 has four columns of rectangular holes with each column containing three holes (only column 130 is fully visible in FIG. 7). Thus, it can be appreciated that the card enclosure 110 is designed such that it can support two full-width printed circuit boards in the upper two horizontal planes by supporting the right edge of the top full-width printed circuit board by two card guides retained by the first row of four rectangular aligning holes in end plate 114 and the left edge of the printed circuit board being supported by two card guides 58 retained by the first row of four rectangular aligning holes in end plate 112. The bottom full-width printed circuit board is similarly retained by the card guides retained in the second row of rectangular aligning holes. Three of the six half-width printed circuit boards are then retained by card guides retained in the bottom three rows of rectangular aligning holes on end plate 114 and by the three rows of rectangular aligning holes in center support 120 and the bottom three rows of rectangular aligning holes in end plate 112.

Figure 7:
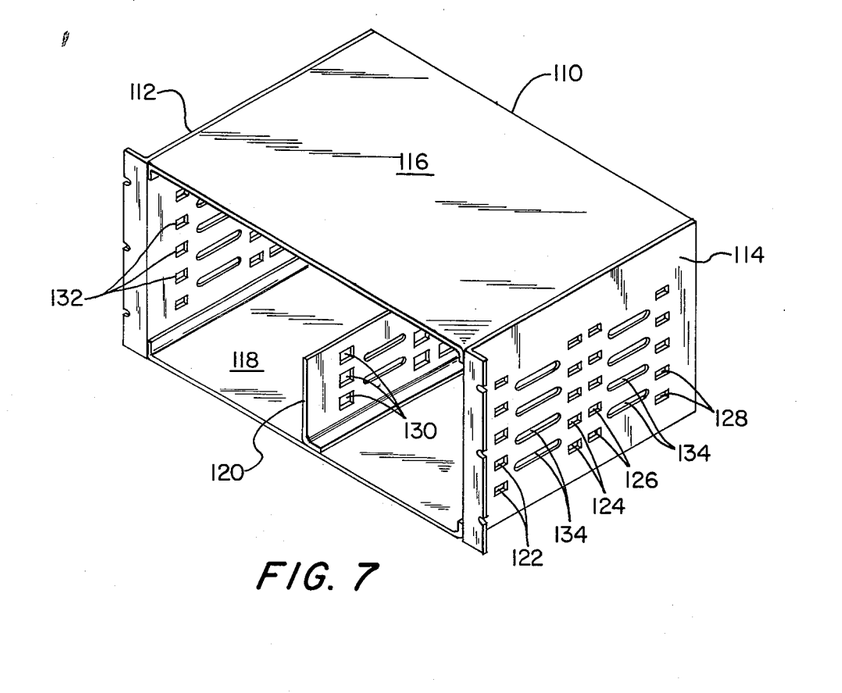
FIG. 7 is a perspective view of a p.c. card enclosure for retaining double depth p.c. cards in five parallel horizontal planes showing the card guides' holes for an enclosure to accommodate up to two full width p.c. board and six half-width p.c. boards.

In FIG. 7, it becomes apparent that larger size printed circuit boards may be supported on two edges by using two or more card guides aligned end-to-end to retain one of the two supported edges of the printed circuit board. This permits one size card guide to be used with printed circuit boards of various lengths. The rectangular aligning holes in end plates 112 and 114 are the half-width size as shown in holes 46, 48 and 50 in FIG. 2 with each row of four holes being aligned with respect to the printed circuit board center line as shown for holes 46 and 48 in FIG. 2. It is apparent that each of these half-width aligning holes is used to retain only one end of a single card guide. The rectangular aligning holes in center support 120 are of the double-width size as shown for hole 54 in FIG. 2 and are likewise aligned with respect to the center line of the printed circuit board as is hole 54 in FIG. 2. It is further apparent that these double-width holes are used such that the center support can retain card guides in a back-to-back manner with card guides being placed on both sides of center support 120. Also shown in FIG. 7 are optional air vents 134 which may be provided in the end plates and center support if side-to-side air ventilation is desired to prevent electronic overheating.

As an alternative to using multiple card guides end-to-end, it is envisioned that a single guide of greater length may be used if one or more additional aligning pegs are placed along the bottom of the card guide. For instance, instead of using two guides on each edge of a printed circuit card, as illustrated in FIG. 7, a single guide could be used if three columns of aligning holes were provided for in the end plates and center support of FIG. 7. That is, if aligning holes 122 and 128 were present and a third column of aligning holes equal distance between columns 122 and 128 was provided, then a single card guide could be retained by snap clips 60 and aligning pegs 62 projecting into the holes in columns 122 and 128, and a center aligning peg projecting into the center column of aligning holes in end plate 114.

In summary, the complete card enclosure comprises only end plates and shelf members, each of which can be fabricated easily from simple shearing, punching and bending operations or by a simple stamping operation. Further, when multiple levels of printed circuit boards are to be enclosed, a single shelf member may be used between two adjacent horizontal levels (as shown in FIG. 1), and in a similar manner, if multiple vertical columns of printed circuit boards are to be supported, a single vertical support may be shared between two adjoining columns of the printed circuit board (as shown in FIG. 7). Further, if the rectangular aligning holes used to retain the card guides must be individually punched in the shelf member, end plate or center support, the present invention has the advantage that the rectangular aligning holes for each end of the card guide may be punched using the same tool, and the punch need only be displaced in one direction (either side-to-side or front-to-back) to punch the next hole, or if a gang punch is used, series of holes. This results from the fact that both ends of a particular card guide are retained either by a full-width aligning hole in back-to-back applications and by half-width aligning holes in single-sided applications and the fact that the full-width aligning holes are centered on the center line of the printed circuit boards and the half-width aligning holes are both on the same side of the printed circuit board center line. Further, a standard card guide may be used in either single-sided or double-sided (back-to-back) applications. Also, by proper placement of the aligning holes with respect to the center line of the printed circuit board to be retained by the card guides, the card guides will accurately align the printed circuit board with its corresponding connector and which can be easily plugged therein without any misalignment problems. Various lengths of the printed circuit boards may be easily accommodated by use of one or more standard length card guides placed end to end. Lastly, by having several standard card guides, each having a different width U-shaped channel, but all having the same overall dimensions, various thickness circuit boards may be easily accommodated by simply inserting the properly sized card guide into the standard sized aligning holes.

While the invention has been particularly shown and described with reference to a preferred embodiment, it will be understood by those skilled in the art that the foregoing and other changes in form, dimension, and detail may be made herein without departing from the spirit and scope of the invention. Having described the invention, what is claimed as new and novel and for which it is desired to secure Letters Patent is:

I claim:

1. A Printed circuit card enclosure and guide assembly comprising:
   A. a pair of horizontally spaced end plates;
   B. a pair of vertically spaced shelf means connected to said end plates;
   C. a plurality of pairs of rectangular apertures in said shelf means;
   D. a plurality of card guides, each end of each of said card guides, including a snap clip and an aligning peg snapped into one aperture of one of said pairs of rectangular apertures, the size and position of said snap clips and aligning pegs on said card guide and size and postion of said rectangular apertures in said shelf means being such as to rigidly retain said snap clip and aligning peg in said rectangular apertures, wherein said aligning peg prevents the lateral and longitudinal movement of said card guide with respect to said shelf member;
   E. each of said card guides having a base and a pair of vertical sides forming a U-shaped cross-section channel for retaining one edge of a printed circuit card;
   F. said base, except for said snap clip and aligning peg, hang an essentially flat surface;
   G. each of said card guides being composed of a material which is sufficiently flexible such that said card guides may be bowed to allow the insertion of said snap clip and aligning peg into said rectangular apertures and sufficiently resilient to return said essentially flat surface of said base to an essentially flat shape after insertion, said snap clip comprising:
      i. a riser formed at a right angle to said essentially flat surface of said center portion; and,
      ii. a clip ear formed at a right angle to said riser to form an L-shaped clip and wherein said L-shaped clips at each of said end portions are oppositely disposed such that the tips of said clip ears extending away from said risers are at the extreme ends of said card guide, and wherein said snap clip can flex toward said aligning peg when said card guide is snapped into said rectangular aperture and sufficient resilient to return to the unflexed position and thereby retain said card guide to said shelf means.

2. The printed circuit card enclosure and guide assembly as claimed in claim 1 wherein said shelf means comprise one-piece shelf members, said shelf members having elongated vent slots extending substantially the full width between said card guides and substantially the full length of said card guides wherein said elongated vent slots permit the circulation of air between a plurality of said printed circuit cards.

3. The printed circuit card enclosure and guide assembly as claimed in claim 1 wherein the length of said card guide is substantially the length of said printed circuit card.

4. The printed circuit card enclosure and card guide assembly as claimed in claim 3 further comprising an at least one additional aligning peg on said base, the size and position of said at least one additional aligning peg being such as to fit into an at least one additional rectangular aperture in said shelf mean, said at least one additional rectangular aperture in said shelf means, said at least one additional rectangular aperture being positioned between each aperture of said plurality of pairs of rectangular apertures with the size and position being as to rigidly retain said at least one additional aligning peg in said at least one additional rectangular aperture, wherein said at least one additional aligning peg prevents the lateral movement of said card guide with respect to said shelf means.

5. The printed circuit card enclosure and guide assembly as claimed in claim 1 wherein the length of said card guide is substantially less than the length of said printed circuit card and one edge of said printed circuit card is retained by a plurality of said card guides lined in an end-to-end fashion and wherein said plurality of said card guides is retained by a plurality of pairs of rectangular apertures in said shelf means and wherein said plurality of pairs of rectangular apertures are aligned in an end-to-end fashion.

6. The printed circuit card enclosure and guide assembly as claimed in claim 5 wherein said shelf means comprise one-piece shelf members, said shelf members having a plurality of elongated vent slots extended substantially the full width between said card guides and substantially the full length of said card guides, wherein said elongated vent slots permit the circulation of air between a plurality of said printed circuit cards.

7. The printed circuit card enclosure and guide assembly as claimed in claim 1 comprising:
   A. at least one additional intermediate shelf means connected to said end plates and vertically spaced between said pair of vertically spaced shelf means;

B. a plurality of pairs of double width rectangular apertures in said intermediate shelf means, wherein said double width rectangular apertures are twice the width of said rectangular apertures; and C. each of said plurality of pairs of double width rectangular apertures rigidly retaining a pair of said card guides, one of said pair of card guides being on the upper surface of said intermediate shelf means and the other of said card guides being on the lower surface of said intermediate shelf means in a back-to-back fashion.

8. The printed circuit card enclosure and guide assembly as claimed in claim 7 wherein said shelf means and said intermediate shelf means comprise one-piece shelf members, said shelf members having elongated vent slots extending substantially the full width of between said card guides and substantially the full length of said card guides wherein said elongated vent slots prmit the circulation of air between a plurality of said printed circuit cards.

9. The printed circuit card enclosure and guide assembly as claimed in claim 1 wherein said enclosure is mountable such that said shelf means are in parallel horizontal planes and said printed circuit card is in a vertical plane.

10. The printed circuit card enclosure and guide assembly as claimed in claim 1 wherein said enclosure is mountable such that said end plates and said printed circuit card are in parallel horizontal planes.

11. The printed circuit card enclosure and guide assembly as claimed in claim 1 wherein said enclosure is mountable such that said end plates and said printed circuit card are in parallel vertical planes and said shelf means are in parallel horizontal planes at right angles to said parallel vertical planes of said end plates and said printed circuit card.

12. A printed circuit card enclosure and guide assembly as claimed in claim 1 wherein such card guide is of unitary construction.

13. A printed circuit card enclosure and guide assembly as claimed in claim 12 wherein said card guide is made of a plastic material.

14. A printed circuit card guide comprising:
A. A base and a pair of vertical sides forming a U-shaped cross-section channel for retaining one edge of a printed circuit card;
B. said base comprising a pair of end portions and a center portion;
C. said center portion having an essentially flat surface;
D. each of said end portions formed with a snap clip and an aligning peg for rigidly retaining said card guide in a pair of rectangular apertures in a shelf member of a printed circuit card enclosure, wherein said aligning peg prevents the lateral and longitudinal movement of said card guide with respect to said shelf member;
E. said card guide being composed of a material which is sufficiently flexible such that said card guide may be bowed to allow the insertion of said snap clip and said aligning peg into said pair of rectangular apertures and yet sufficiently resilient to return said center portion to an essentially flat shape after insertion, said snap clip comprising:
i. a riser formed at a right angle to said essentially flat surface of said center portion; and,
ii. a clip ear formed at a right angle to said riser to form an L-shaped clip and wherein said L-shaped clips at each of said end portions are oppositely disposed such that the tips of said clip ears extending away from said risers are at the extreme ends of said card guide, and wherein said snap clip is sufficiently flexible such that said snap clip can flex toward said aligning peg when said card guide is snapped into said rectangular aperture and sufficient resilient to return to the unflexed position and thereby retain said card guide to said shelf member.

15. The printed circuit card guide as claimed in claim 14 wherein a cross-section taken through said aligning peg in a plane parallel to said essentially flat surface of said center portion will result in a rectangular cross-section.

16. The printed circuit card guide as claimed in claim 15 wherein said snap clip and aligning peg are molded in said end portion such that they are asymmetrically positioned with respect to a center line drawn through the middle of said U-shaped cross-sectioned channel such that one edge of said snap clip and said aligning peg is on said center line.

17. The printed circuit card guide as claimed in claim 16 wherein both said snap clip and said aligning peg of each of said end portions are on the same side of said center line and both of said pair of end portions have said snap clip and said aligning peg formed on the same side of said center line such that each of said snap clips and said aligning pegs are on the same side of said center line.

18. The printed circuit card guide as claimed in claim 17 wherein the length of said riser is substantially equal to the thickness of said shelf member and the length that said aligning peg projects from said essentially flat surface of said center portion is less than but substantially equal to the thickness of said shelf member.

19. The printed circuit card guide as claimed in claim 18 wherein said aligning peg is positioned adjacent to said snap clip but yet sufficiently distant from said snap clip such that said snap clip can flex toward said aligning peg such that the distance between a surface of said aligning peg towards said center portion and a furthest tip of said clip ear is less than the length of said rectangular aperture in said shelf member such that after insertion of said aligning peg and said snap clip into said rectangular aperture an outer portion of said clip ear will engage a side of said shelf member opposite a side of said shelf member adjacent to said essentially flat surface of said center portion.

20. The printed circuit card guide as claimed in claim 19 wherein each of said end portions contains a notch on a side of said center line opposite said snap clip and said aligning peg to receive a snap clip of an opposing card guide inserted into a pair of double-width rectangular apertures in a single one of said shelf members, one of said card guide and one of said opposing card guide being inserted into said double-width rectangular apertures in a back-to-back fashion.

21. The printed circuit card guide as claimed in claim 20 wherein each end of said base and said pair of vertical sides are bevelled to aid in the insertion of said printed circuit card in said U-shaped cross-section channel.

22. The card guide as claimed in claim 20 wherein said center portion is formed with at least one additional aligning peg and wherein said additional aligning peg is on the same side as said center line as each of said snap clips and said aligning pegs.

23. The card guide as claimed in claim 20 wherein the a tip of said snap clip and a heel of said aligning peg are radiused to aid in the insertion of said snap clip and aligning peg into one of said pair of rectangular apertures.

24. A printed circuit card guide as claimed in claim 14 wherein said card guide is of unitary construction.

25. A printed circuit card guide as claimed in claim 24 wherein said card guide is made of a plastic material.

* * * * *